(12) United States Patent
Moschiano et al.

(10) Patent No.: US 10,885,987 B2
(45) Date of Patent: Jan. 5, 2021

(54) READING EVEN DATA LINES OR ODD DATA LINES COUPLED TO MEMORY CELL STRINGS

(71) Applicant: MICRON TECHNOLOGY, INC., Boise, ID (US)

(72) Inventors: Violante Moschiano, Avezzano (IT); Andrea D'Alessandro, L'Aquila (IT); Tommaso Vali, Sezze (IT); Giovanni Santin, Rieti (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/226,713

(22) Filed: Dec. 20, 2018

(65) Prior Publication Data

US 2020/0202950 A1   Jun. 25, 2020

(51) Int. Cl.
  *G11C 16/26* (2006.01)
  *G11C 16/16* (2006.01)
  *G11C 16/24* (2006.01)
  *G11C 16/08* (2006.01)
  *G11C 16/04* (2006.01)

(52) U.S. Cl.
  CPC .......... *G11C 16/26* (2013.01); *G11C 16/0483* (2013.01); *G11C 16/08* (2013.01); *G11C 16/16* (2013.01); *G11C 16/24* (2013.01)

(58) Field of Classification Search
  None
  See application file for complete search history.

(56) References Cited

U.S. PATENT DOCUMENTS

| | | | | |
|---|---|---|---|---|
| 5,963,475 A | * | 10/1999 | Choi ................ | G11C 8/12 365/185.11 |
| 6,650,567 B1 | * | 11/2003 | Cho ................. | G11C 17/123 365/185.17 |
| 8,913,453 B2 | * | 12/2014 | Baek .............. | G11C 16/26 365/185.11 |
| RE45,890 E | * | 2/2016 | Itagaki ........... | G11C 16/0483 |
| 2006/0164890 A1 | * | 7/2006 | Lee ................. | G11C 16/12 365/185.28 |
| 2006/0245251 A1 | * | 11/2006 | Shirota .......... | G11C 16/0483 365/185.17 |
| 2007/0002625 A1 | * | 1/2007 | Park .............. | G11C 16/08 365/185.12 |
| 2007/0195610 A1 | * | 8/2007 | Park .............. | G11C 16/16 365/185.29 |
| 2008/0239812 A1 | * | 10/2008 | Abiko ............ | G11C 11/5628 365/185.12 |
| 2009/0091981 A1 | * | 4/2009 | Park .............. | G11C 16/3418 365/185.12 |
| 2013/0094287 A1 | * | 4/2013 | Lee ................. | G11C 16/06 365/185.2 |
| 2013/0114345 A1 | * | 5/2013 | Lee ................. | G11C 16/0483 365/185.22 |

(Continued)

*Primary Examiner* — J. H. Hur
(74) *Attorney, Agent, or Firm* — Dicke, Billig & Czaja, PLLC (57) ABSTRACT

A method for reading an array of memory cells includes enabling a current to flow through even data lines of the array of memory cells. The method includes blocking a current from flowing through odd data lines of the array of memory cells. The method includes sensing data stored in memory cells coupled to the even data lines.

20 Claims, 11 Drawing Sheets

(56) References Cited

U.S. PATENT DOCUMENTS

| | | | |
|---|---|---|---|
| 2013/0272067 A1* | 10/2013 | Lee | G11C 16/10 |
| | | | 365/185.11 |
| 2014/0185383 A1* | 7/2014 | Shibata | G11C 11/5628 |
| | | | 365/185.17 |
| 2015/0060995 A1* | 3/2015 | Sakamoto | G11C 16/0466 |
| | | | 257/326 |

* cited by examiner

READING EVEN DATA LINES OR ODD DATA LINES COUPLED TO MEMORY CELL STRINGS

TECHNICAL FIELD

The present disclosure relates generally to memory and, in particular, in one or more embodiments, the present disclosure relates to apparatus and methods to read memory cells of memory devices.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

All bit line (ABL) sensing may enhance flash array performance by sensing all bit lines connected to page buffers simultaneously. ABL sensing, however, may be limited by bit line to bit line interaction. Shielded bit line (SBL) sensing divides the bit lines into even bit lines and odd bit lines and senses the even bit lines or the odd bit lines while the other of the even bit lines and the odd bit lines are biased to a predefined voltage (e.g., ground). SBL sensing, however, may result in slower performance.

For the reasons stated above, and for other reasons stated below which will become apparent to those skilled in the art upon reading and understanding the present specification, there is a need in the art for alternative methods for implementing sensing operations, and system and apparatus to perform such methods.

DETAILED DESCRIPTION

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Disclosed herein are apparatus and methods to read memory cells by sensing even bit lines separately from odd bit lines while floating the deselected bit lines. By floating the deselected bit lines during sensing operations, the effects due to bit line capacitance between bit lines may be substantially reduced. In this way, sensing operations using the apparatus and methods disclosed herein may be up to two times faster than shielded bit line (SBL) sensing where the deselected bit lines are biased to a predefined voltage.

Figure 1:
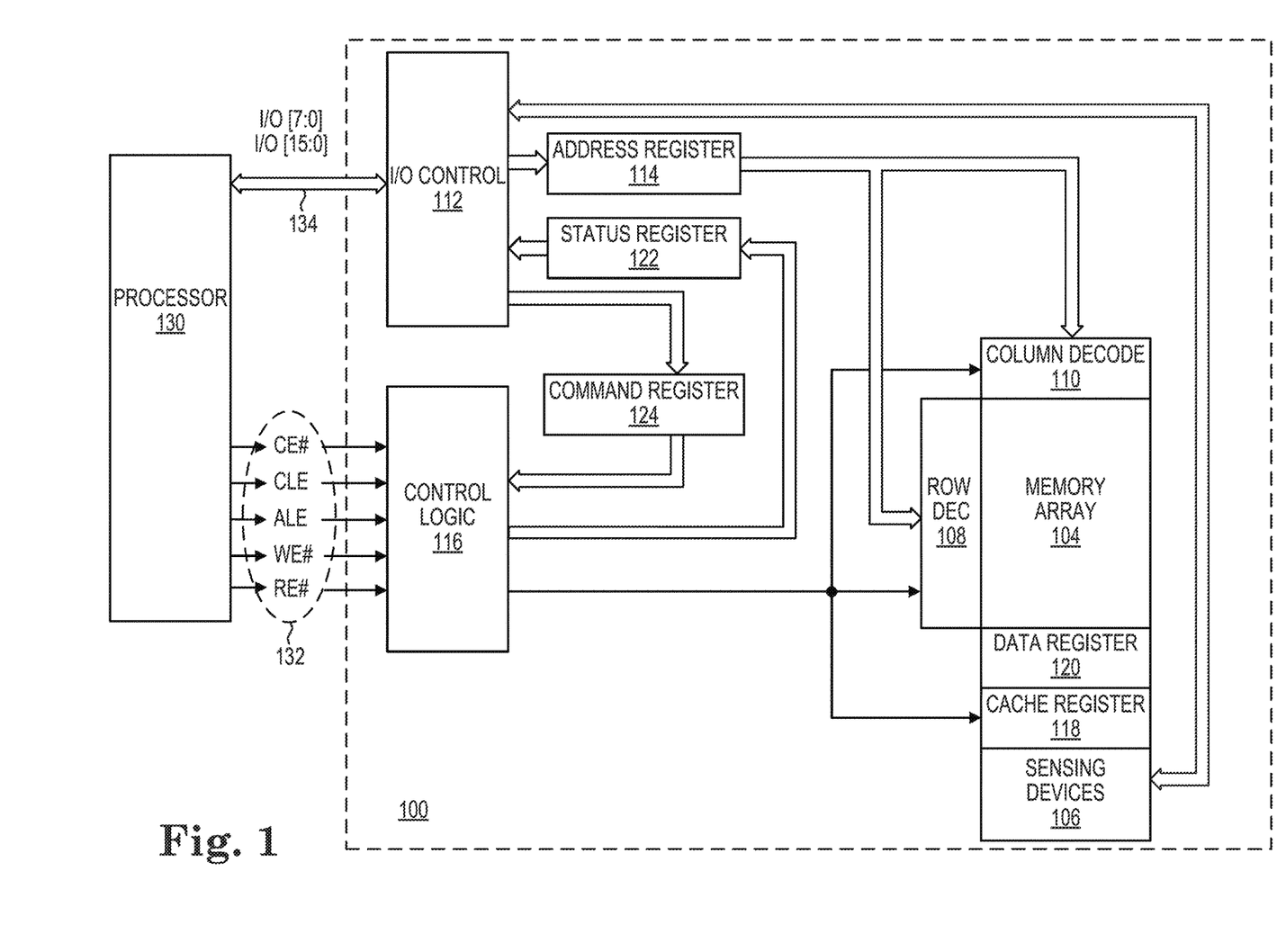
FIG. 1 is a simplified block diagram of one embodiment of a memory device in communication with a processor as part of an electronic system.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE #, a command latch enable CLE, an address latch enable ALE, a write enable WE #, and a read enable RE #. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
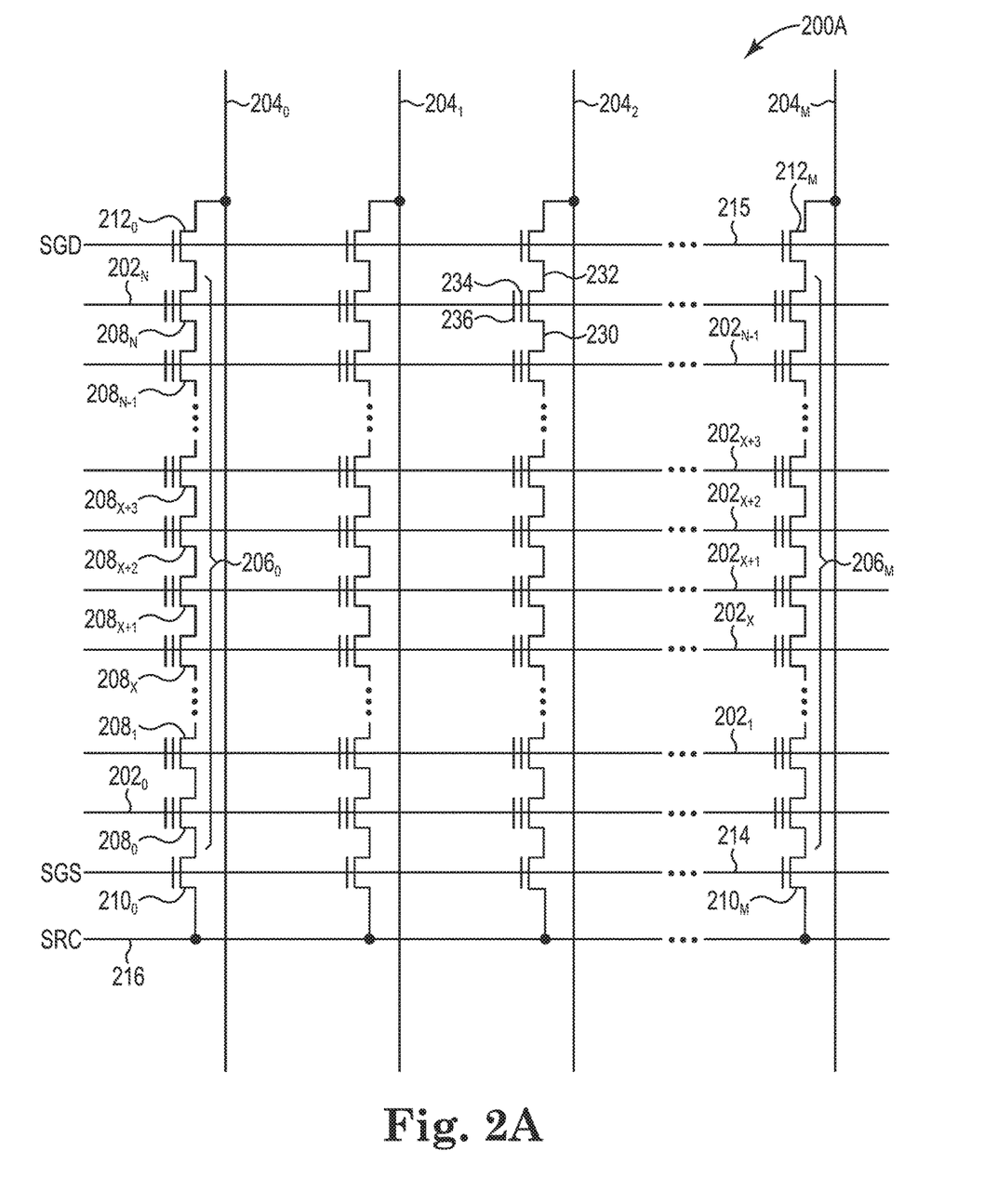
FIGS. 2A-2C are schematic diagrams of portions of an array of memory cells as could be used in a memory device of the type described with reference to FIG. 1.

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$ $204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
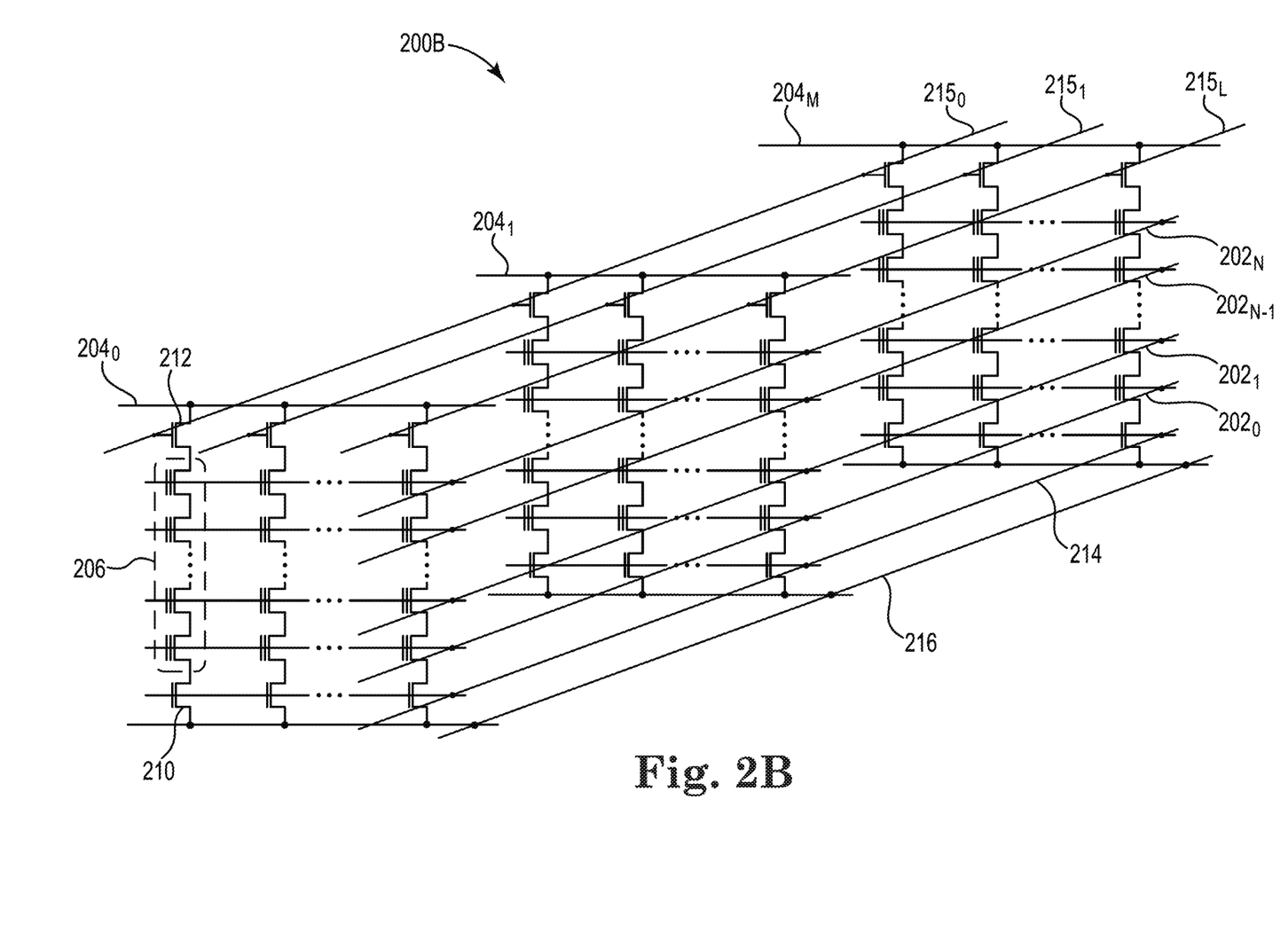

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$ to $204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$ to $215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
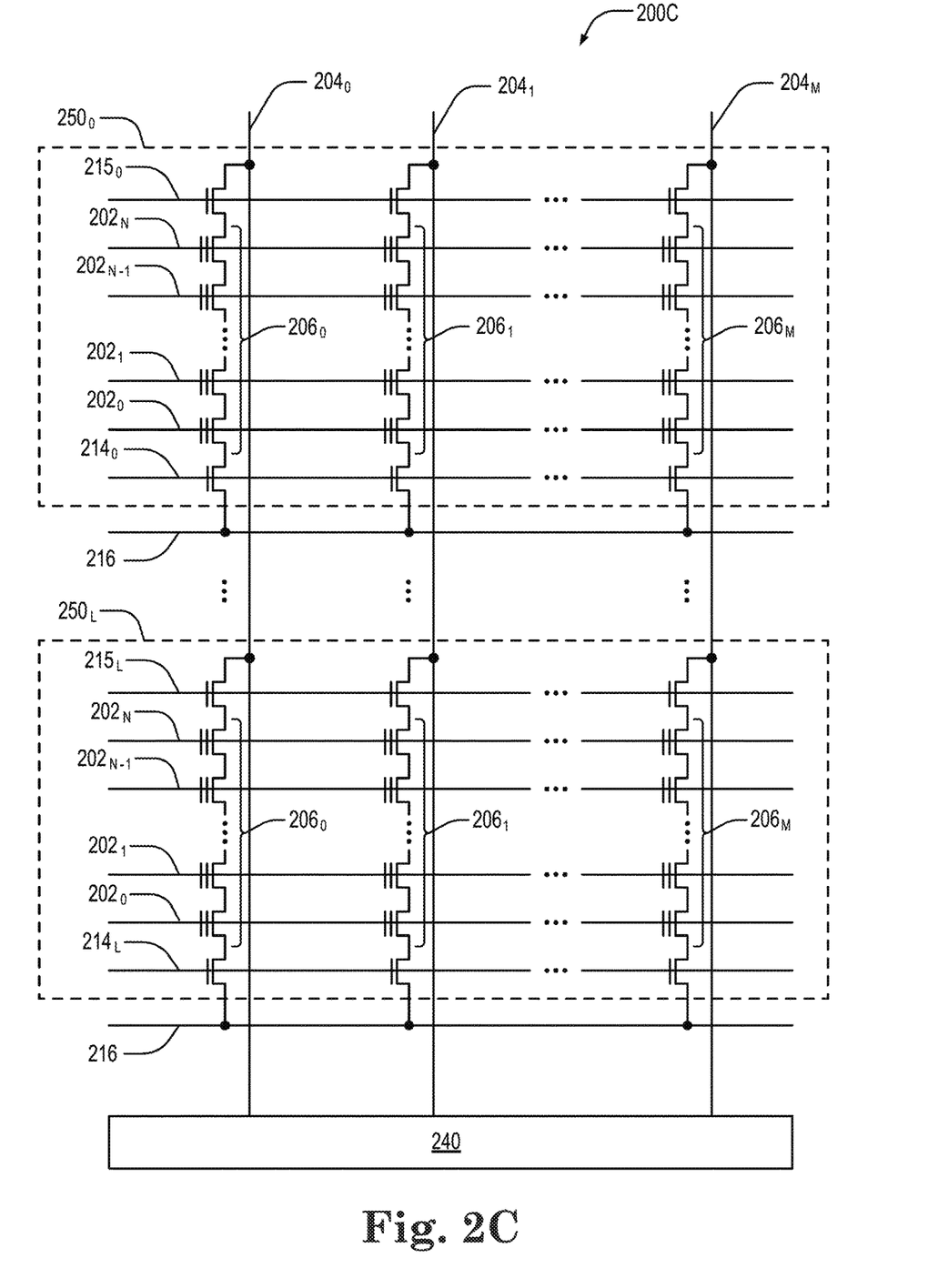

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$ to $250_L$ might be commonly selectively connected to the source 216. Access lines 202 and select lines 214 and 215 of one block of memory cells 250 may have no direct connection to access lines 202 and select lines 214 and 215, respectively, of any other block of memory cells 250.

The data lines $204_0$ to $204_M$ may be connected (e.g., selectively connected) to a buffer portion 240, which might be a portion of a page buffer of the memory. The buffer portion 240 might correspond to a memory plane (e.g., the set of blocks of memory cells $250_0$ to $250_L$). The buffer portion 240 might include sensing devices (not shown) for sensing data values indicated on respective data lines 204, and corresponding registers (not shown) for storage of the sensed data values from its corresponding memory plane.

Although the examples of FIGS. 2A-2C are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
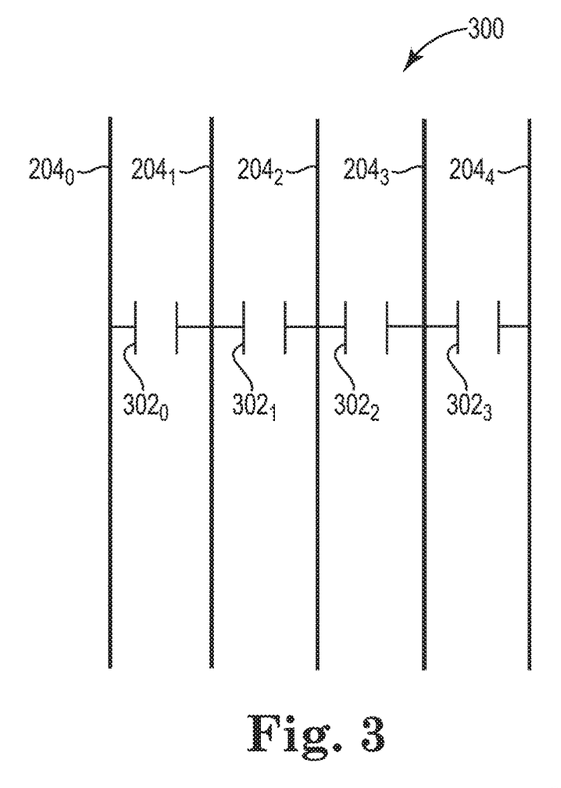
FIG. 3 is a schematic diagram of portions of an array of memory cells including bit lines and virtual capacitance between the bit lines.

FIG. 3 is a schematic diagram illustrating portions of an array of memory cells 300 including bit lines $204_0$ to $204_4$ and virtual capacitance $302_0$ to $302_3$ between the bit lines $204_0$ to $204_4$. Bit lines $204_0$, $204_2$, and $204_4$ are even bit lines, and bit lines $204_1$ and $204_3$ are odd bit lines. Virtual capacitance $302_0$ is between even bit line $204_0$ and odd bit line $204_1$. Virtual capacitance $302_1$ is between odd bit line $204_1$ and even bit line $204_2$. Virtual capacitance $302_2$ is between even bit line $204_2$ and odd bit line $204_3$. Virtual capacitance $302_3$ is between odd bit line $204_3$ and even bit line $204_4$. Virtual capacitance $302_0$ to $302_3$ may limit the performance of SBL sensing where the deselected bit lines are biased to a predefined voltage. This may be the case since when biasing the deselected bit lines to a predefined voltage, the settling time of the selected bit lines during a sensing operation may be longer due to the charging of the virtual capacitance between the selected and deselected bit lines.

Figure 4:
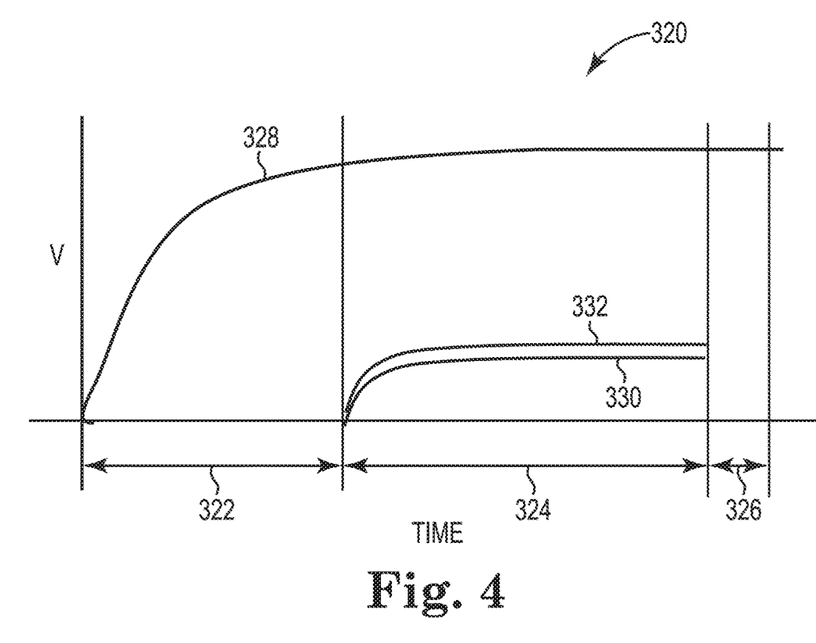
FIG. 4 is a chart depicting one example of a sensing operation.

FIG. 4 is a chart 320 depicting one example of a sensing (e.g., read or verify) operation. Chart 320 illustrates a word line voltage 328, selected bit line (e.g., even bit lines $204_0$, $204_2$, etc.) voltage 330, and deselected bit line (e.g., odd bit lines $204_1$, $204_3$, etc.) voltage 332 versus time. The sensing operation begins by ramping up the word line voltage 328 to a first predefined voltage during a first period 322. With the word line voltage 328 at the first predefined voltage, the selected bit line voltage 330 is ramped up (e.g., precharged) to a second predefined voltage during a second period 324 with the deselected bit lines floating. With the deselected bit lines floating, the deselected bit line voltage 332 ramps up with the selected bit line voltage 330 due to the capacitive coupling between the selected and deselected bit lines. The deselected bit line voltage 332 may be slightly above the selected bit line voltage 330 due to capacitive coupling between the words lines and the deselected bit lines. Due to the floating of the deselected bit lines, the settling time of the selected bit lines may be quicker than the settling time would be if the deselected bit lines were connected to a predefined voltage. During a third period 326, a read strobe may be applied to read the selected memory cells.

The sensing operation of FIG. 4 may be implemented without hardware changes to the memory array 200A, 200B, or 200C of FIGS. 2A-2C as described below with reference to FIG. 5 or with hardware changes as described below with reference to FIG. 6.

Figure 5:
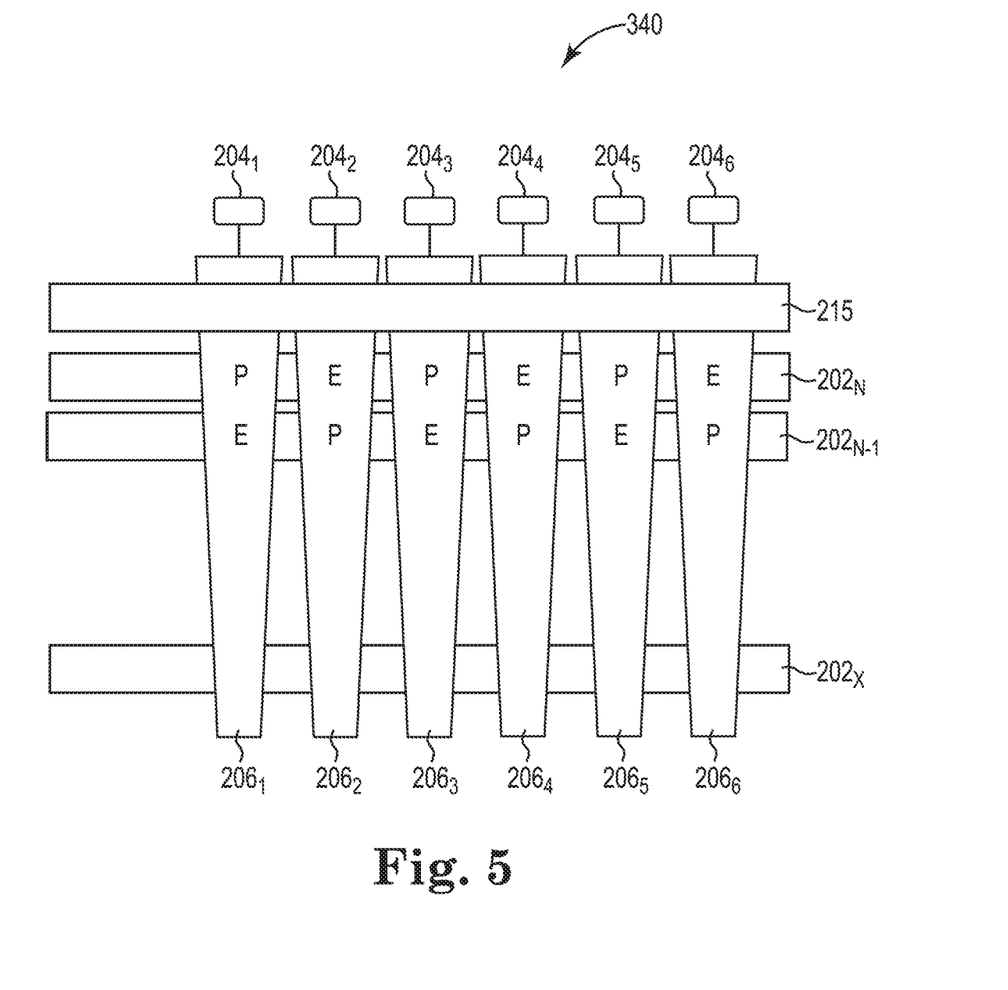
FIG. 5 is a schematic diagram of portions of an example array of memory cells as could be used to implement the sensing operation described with reference to FIGS. 3 and 4.

FIG. 5 is a schematic diagram of portions of an example array of memory cells 340 as could be used to implement the sensing operation described with reference to FIGS. 3 and 4. The portion of the array of memory cells 340 includes a plurality of bit lines $204_1$ to $204_6$, a select line 215, a plurality of memory cell strings $206_1$ to $206_6$, a first select word line $202_N$, a second select word line $202_{N-1}$, a selected word line $202_x$, and control logic (e.g., control logic 116 of FIG. 1) not shown in FIG. 5. The plurality of bit lines $204_1$ to $204_6$ includes even bit lines $204_2$, $204_4$, and $204_6$, and odd bit lines $204_1$, $204_3$, and $204_5$. The plurality of memory cell strings $206_1$ to $206_6$ includes even memory cell strings $206_2$, $206_4$, and $206_6$ and odd memory cell strings $206_1$, $206_3$, and $206_5$. The first select word line $202_N$ is coupled to an erased memory cell (indicated by "E") of each even memory cell string $206_2$, $206_4$, and $206_6$ and to a programmed memory cell (indicated by "P") of each odd memory cell string $206_1$, $206_3$, and $206_5$. The second select word line $202_{N-1}$ is coupled to a programmed memory cell of each even memory cell string $206_2$, $206_4$, and $206_6$ and to an erased memory cell of each odd memory cell string $206_1$, $206_3$, and $206_5$. In this example, the memory cells coupled to the first select word line $202_N$ and to the second select word line $202_{N-1}$ are not used to store data but rather to float the deselected bit lines during sensing operations. While the first select word line $202_N$ and the second select word line $202_{N-1}$ are illustrated as being adjacent to one another, the first select word line and the second select word line do not have to be adjacent to one another.

The control logic activates the second select word line $202_{N-1}$ and deactivates the first select word line $202_N$ to read memory cells coupled to the even bit lines $204_2$, $204_4$, and $204_6$. In this way, a current flows through the even bit lines $204_2$, $204_4$, and $204_6$ while the odd bit lines $204_1$, $204_3$, and $204_5$ are floated. Likewise, the control logic deactivates the second select word line $202_{N-1}$ and activates the first select word line $202_N$ to read memory cells coupled to the odd bit lines $204_1$, $204_3$, and $204_5$. In this way, a current flows through the odd bit lines $204_1$, $204_3$, and $204_5$ while the even bit lines $204_2$, $204_4$, and $204_6$ are floated. In one example, the control logic initializes the memory by erasing the memory cell of each even memory cell string $206_2$, $206_4$, and $206_6$ and programming the memory cell of each odd memory cell string $206_1$, $206_3$, and $206_5$ coupled to the first select word line $202_N$, and by programming the memory cell of each even memory cell string $206_2$, $206_4$, and $206_6$ and erasing the memory cell of each odd memory cell string $206_1$, $206_3$, and $206_5$ coupled to the second select word line $202_{N-1}$.

Referring back to FIGS. 2A-2C in combination with FIG. 5, the portion of the array of memory cells 340 may include a plurality of first select transistors 212 and a plurality of second select transistors 210. Each first select transistor 212 may have a source-drain path coupled between a bit line $204_1$ to $204_6$ and a memory cell string $206_1$ to $206_6$. Each second select transistor 210 may have a source-drain path coupled to a memory cell string $206_1$ to $206_6$. In one example, the source-drain path of each second select transistor 210 might be coupled between a memory cell string $206_1$ to $206_6$ and the common source 216. Each of the plurality of first select transistors 212 might be directly coupled to a memory cell 208 coupled to the first select word line $202_N$. Each memory cell 208 coupled to the first select word line $202_N$ might be directly coupled to a memory cell 208 coupled to the second select word line $202_{N-1}$.

Figure 6:
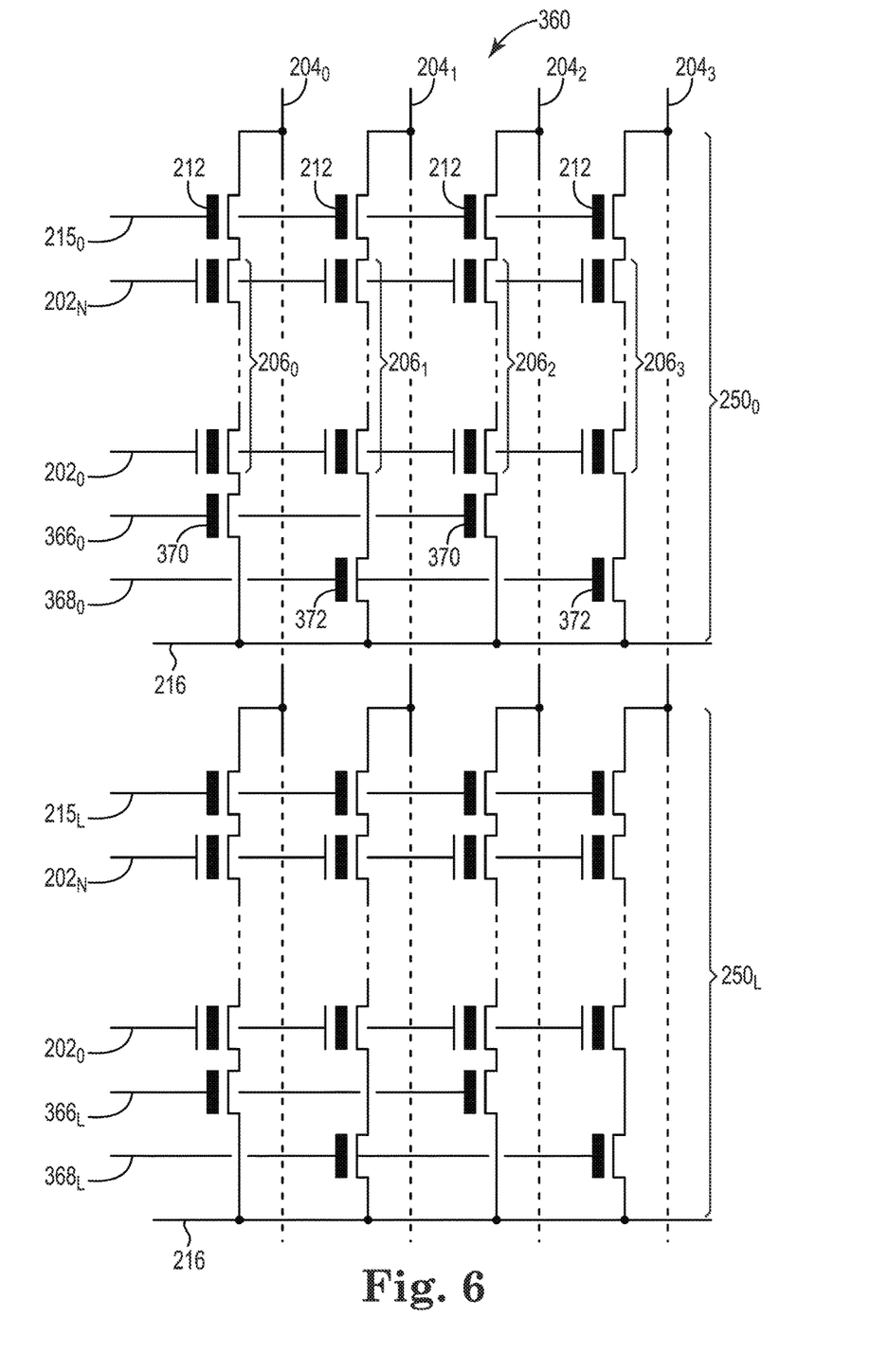
FIG. 6 is a schematic diagram of portions of another example of an array of memory cells as could be used to implement the sensing operation described with reference to FIGS. 3 and 4.

FIG. 6 is a schematic diagram of portions of another example of an array of memory cells 360 as could be used to implement the sensing operation described with reference to FIGS. 3 and 4. The array of memory cells 360 includes blocks of memory cells $250_0$ to $250_L$. The array of memory cells 360 is similar to the array of memory cells 200C of FIG. 2C, except that the array of memory cells 360 includes even select lines $366_0$ to $366_L$ and odd select lines $368_0$ to $368_L$ in place of select lines $214_0$ to $214_L$.

Memory 360 includes a plurality of bit lines $204_0$ to $204_3$, a plurality of memory cell strings $206_0$ to $206_3$, a plurality of word lines $202_0$ to $202_N$, a plurality of first select transistors 370, a plurality of second select transistors 372, a plurality of third select transistors 212, a common source 216, and control logic (e.g., control logic 116 of FIG. 1) not shown in FIG. 6. The plurality of bit lines $204_0$ to $204_3$ includes even bit lines $204_0$ and $204_2$ and odd bit lines $204_1$ and $204_3$. The plurality of memory cell strings $206_0$ to $206_3$ includes even memory cell strings $206_0$ and $206_2$ and odd memory cell strings $206_1$ and $206_3$. Each first select transistor 370 has a source-drain path coupled between an even memory cell string $206_0$ and $206_2$ and the common source 216. The first select transistors 370 for a selected block of memory cells $250_0$ to $250_L$ can be activated by biasing the corresponding select line $366_0$ to $366_L$. Each second select transistor 372 has a source-drain path coupled between an odd memory cell string $206_1$ and $206_3$ and the common source 216. The second select transistors 372 for a selected block of memory cells $250_0$ to $250_L$ can be activated by biasing the corresponding select line $368_0$ to $368_L$. Each third select transistor 212 has a source-drain path coupled between a bit line $204_0$ to $204_3$ and a memory cell string $206_0$ to $206_3$ as previously described. Each word line $202_0$ to $202_N$ is coupled to a memory cell of each memory cell string $206_0$ to $206_3$ as previously described.

The control logic activates the first select transistors 370 and deactivates the second select transistors 372 to read memory cells coupled to the even bit lines $204_0$ and $204_2$. In this way, a current flows through the even bit lines $204_0$ and $204_2$ while the odd bit lines $204_1$ and $204_3$ are floated. Likewise, the control logic activates the second select transistors 372 and deactivates the first select transistors 370 to read memory cells coupled to the odd bit lines $204_1$ and $204_3$. In this way, a current flows through the odd bit lines $204_1$ and $204_3$ while the even bit lines $204_0$ and $204_2$ are floated.

Figure 7A:
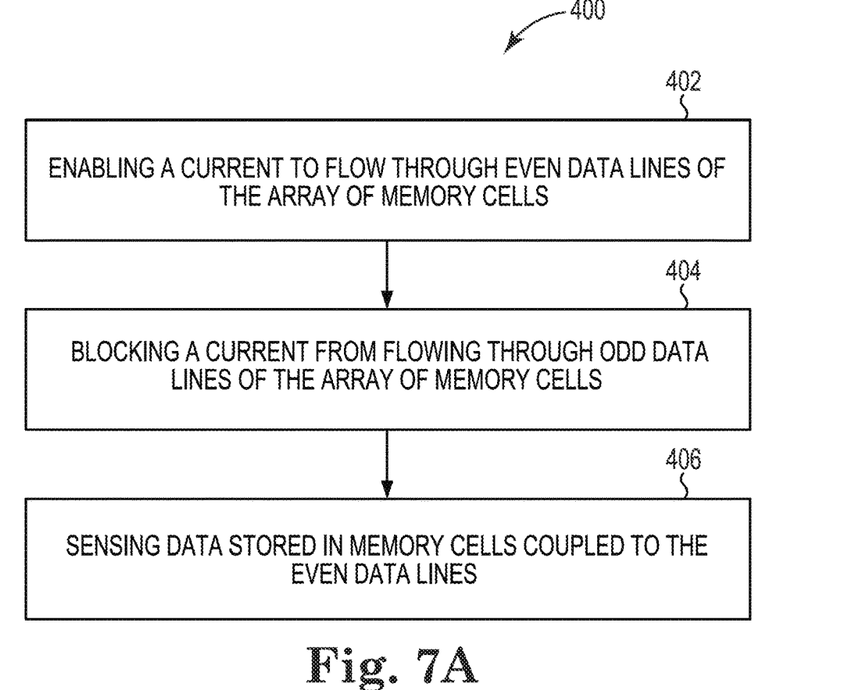
FIGS. 7A-7B are flow diagrams illustrating one embodiment of a method for reading an array of memory cells.
Figure 7B:
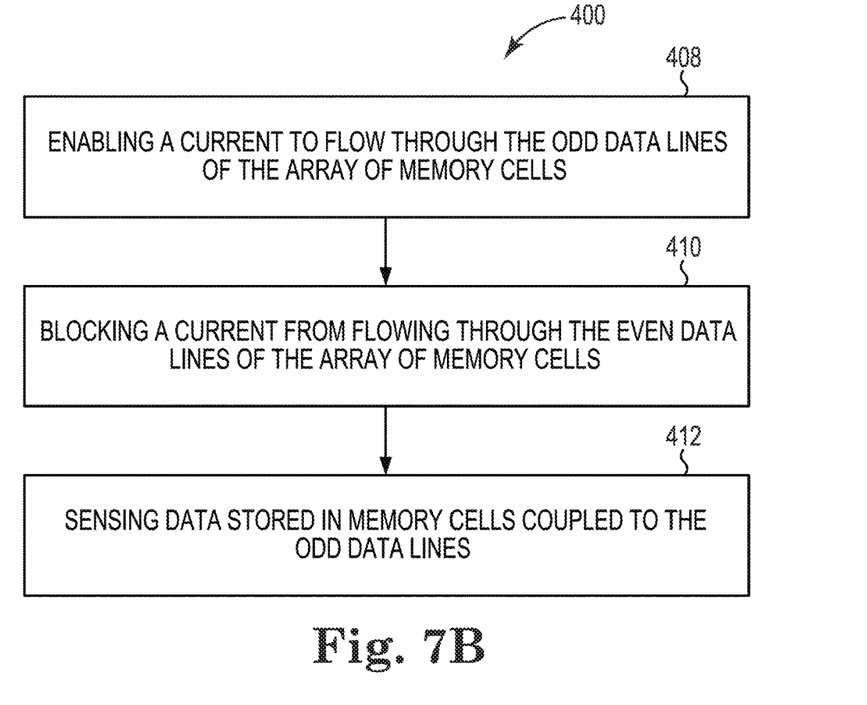

FIGS. 7A-7B are flow diagrams illustrating one embodiment of a method 400 for reading an array of memory cells. In one example, method 400 may be implemented by the array of memory cells 340 or 360 previously described and illustrated with reference to FIGS. 5 and 6, respectively. As illustrated in FIG. 7A, at 402 method 400 includes enabling a current to flow through even data lines, e.g., even bit lines, of the array of memory cells. At 404, method 400 includes blocking a current from flowing through odd data lines, e.g., odd bit lines, of the array of memory cells. In one example, blocking the current from flowing through the odd data lines may include floating the odd data lines. At 406, method 400 includes sensing data stored in memory cells coupled to the even data lines.

In one example, enabling the current to flow through the even data lines may include connecting the even data lines to a common source, and blocking the current from flowing through the odd data lines may include disconnecting the odd data lines from the common source. In another example, enabling the current to flow through the even data lines may include deactivating a first select access line, e.g., first select word line, and blocking the current from flowing through the odd data lines may include activating a second select access line, e.g., second select word line.

As illustrated in FIG. 7B, at 408 method 400 may further include enabling a current to flow through the odd data lines of the array of memory cells. At 410, method 400 may further include blocking a current from flowing through the even data lines of the array of memory cells. In one example, blocking the current from flowing through the even data lines may include floating the even data lines. At 412, method 400 may further include sensing data stored in memory cells coupled to the odd data lines. In one example, enabling the current to flow through the odd data lines may include connecting the odd data lines to a common source, and blocking the current from flowing through the even data lines may include disconnecting the even data lines from the common source. In another example, enabling the current to flow through the odd data lines may include deactivating a second select access line, and blocking the current from flowing through the even data lines may include activating a first select access line.

Figure 8A:
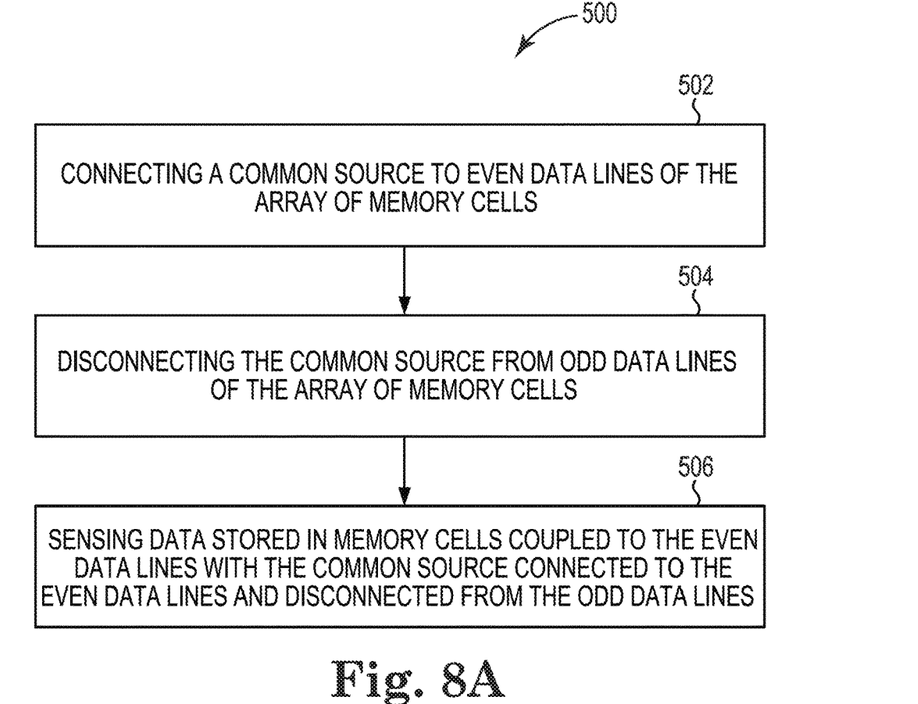
FIGS. 8A-8B are flow diagrams illustrating another embodiment of a method for reading an array of memory cells.
Figure 8B:
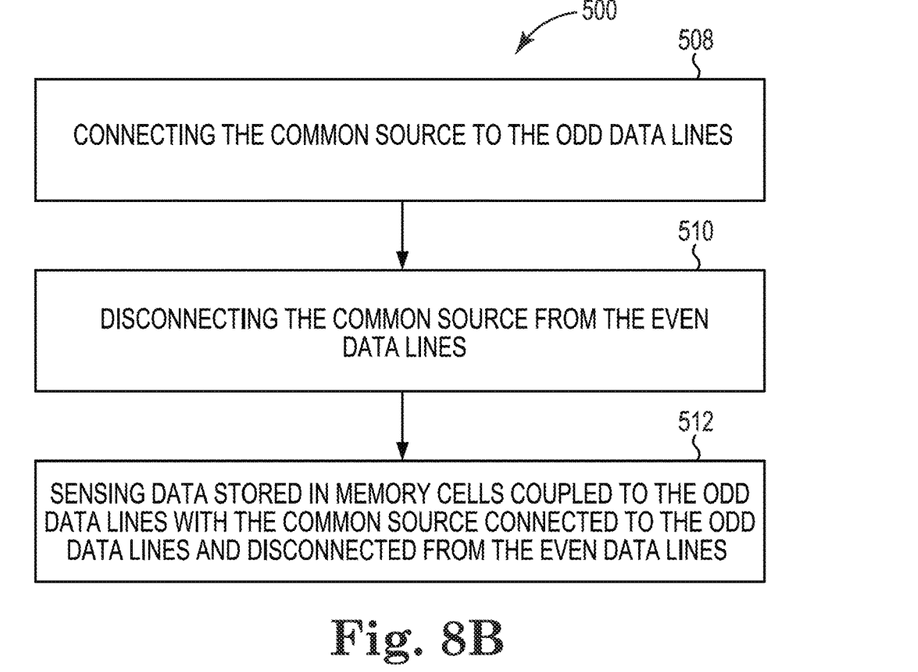

FIGS. 8A-8B are flow diagrams illustrating another embodiment of a method 500 for reading an array of memory cells. In one example, method 500 may be implemented by the array of memory cells 360 previously described and illustrated with reference to FIG. 6. As illustrated in FIG. 8A, at 502 method 500 includes connecting a common source to even data lines of the array of memory cells. In one example, connecting the common source to the even data lines may include activating a plurality of first select transistors, each first select transistor having a source-drain path coupled between an even data line and the common source. At 504, method 500 includes disconnecting the common source from odd data lines of the array of memory cells. In one example, disconnecting the common source from the odd data lines may include deactivating a plurality of second select transistors, each second select transistor having a source-drain path coupled between an odd data line and the common source. At 506, method 500 includes sensing data stored in memory cells coupled to the even data lines with the common source connected to the even data lines and disconnected from the odd data lines.

In one example, sensing the data stored in the memory cells coupled to the even data lines may include ramping up a selected access line coupled to memory cells for each even data line and each odd data line, activating the even data lines, and sensing the data stored in the memory cells for each even data line for the selected access line. In this example, activating the even data lines may include activating a plurality of select transistors, each select transistor having a source-drain path coupled between a data line and a memory cell string.

As illustrated in FIG. 8B, at 508 method 500 may further include connecting the common source to the odd data lines. At 510, method 500 may further include disconnecting the common source from the even data lines. At 512, method 500 may further include sensing data stored in memory cells coupled to the odd data lines with the common source connected to the odd data lines and disconnected from the even data lines.

Figure 9A:
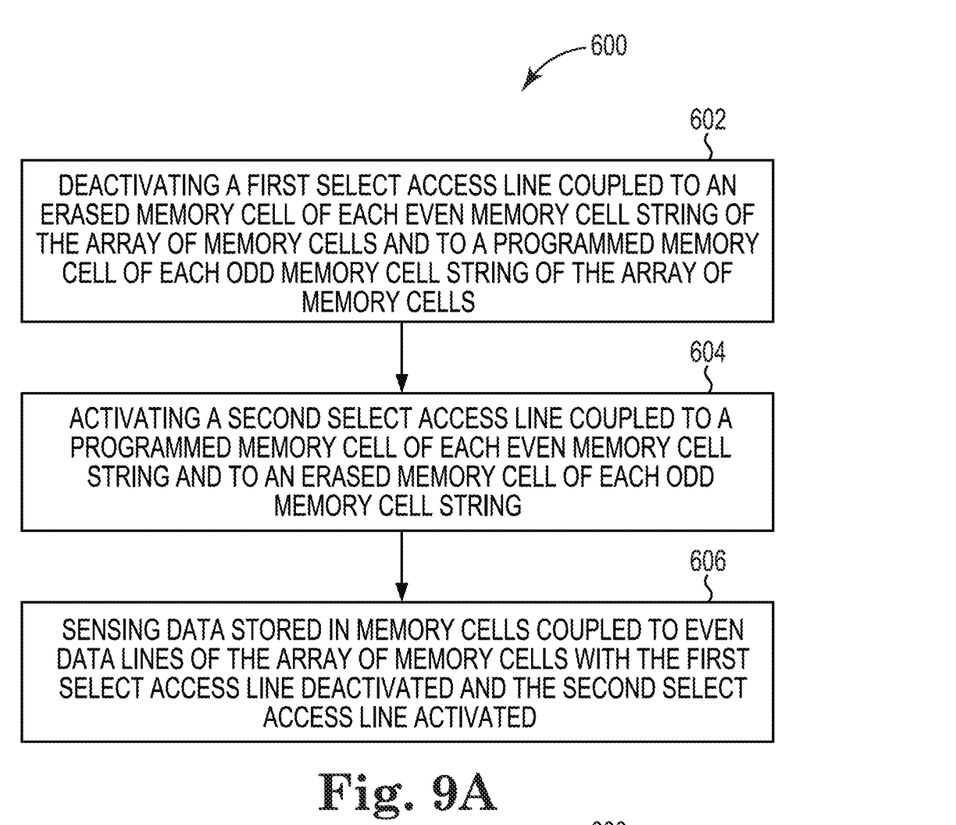
FIGS. 9A-9C are flow diagrams illustrating another embodiment of a method for reading an array of memory cells.
Figure 9B:
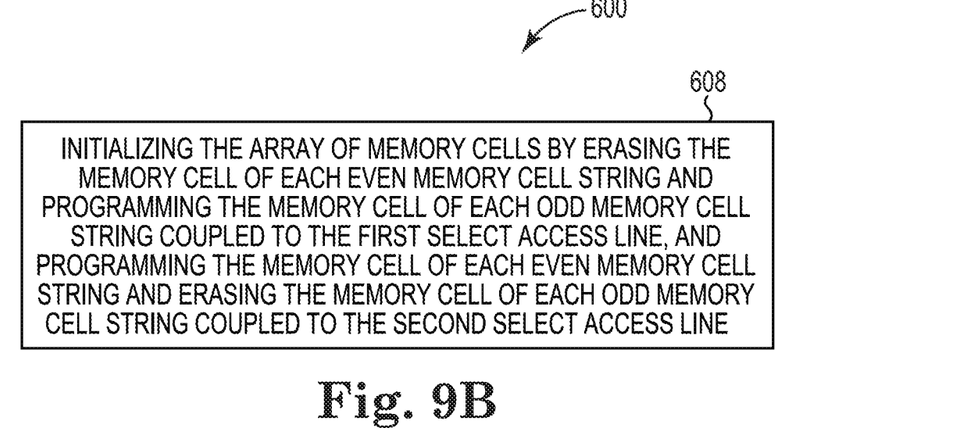
Figure 9C:
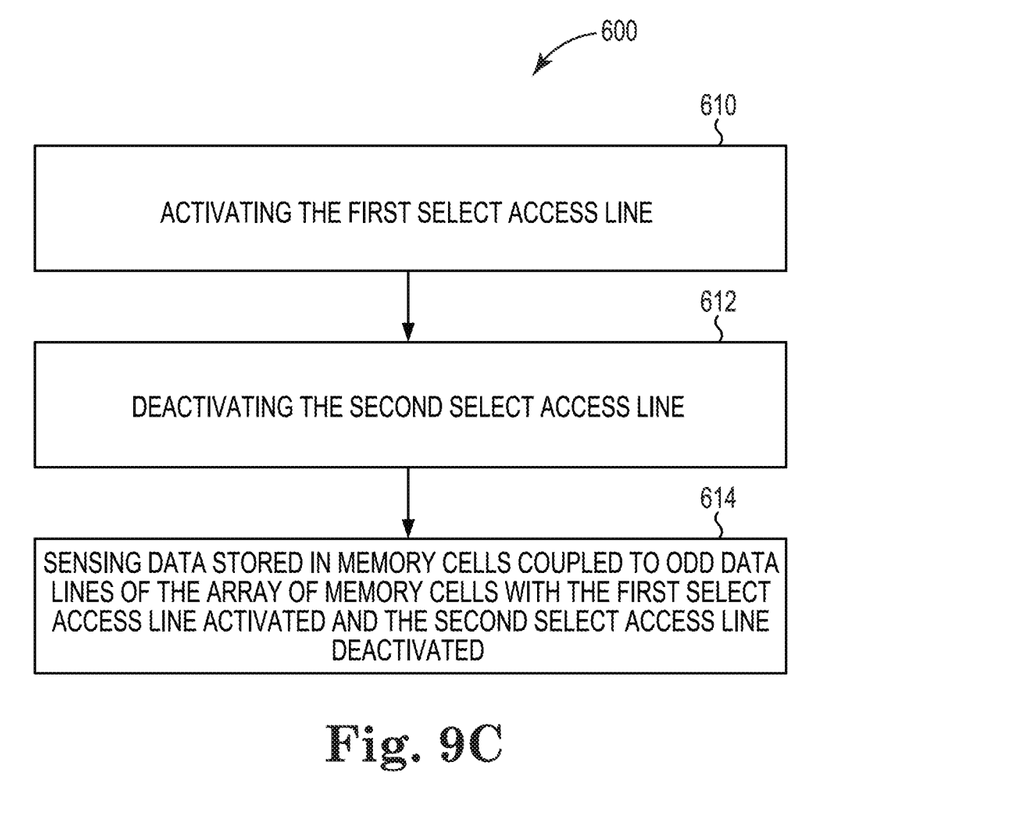

FIGS. 9A-9C are flow diagrams illustrating another embodiment of a method 600 for reading an array of memory cells. In one example, method 600 may be implemented by the array of memory cells 340 previously described and illustrated with reference to FIG. 5. As illustrated in FIG. 9A, at 602 method 600 includes deactivating a first select access line coupled to an erased memory cell of each even memory cell string of the array of memory cells and to a programmed memory cell of each odd memory cell string of the array of memory cells. At 604, method 600 includes activating a second select access line coupled to a programmed memory cell of each even memory cell string and to an erased memory cell of each odd memory cell string. At 606, method 600 includes sensing data stored in memory cells coupled to even data lines of the array of memory cells with the first select access line deactivated and the second select access line activated. In one example, sensing the data stored in the memory cells coupled to the even data lines may include ramping up a selected access line coupled to memory cells for each even data line and each odd data line, activating the even data lines, and sensing the data stored in the memory cells of each even data line for the selected access line.

As illustrated in FIG. 9B, at 608 method 600 may further include initializing the array of memory cells by erasing the memory cell of each even memory cell string and programming the memory cell of each odd memory cell string coupled to the first select access line, and programming the memory cell of each even memory cell string and erasing the memory cell of each odd memory cell string coupled to the second select access line. As illustrated in FIG. 9C, at 610 method 600 may further includes activating the first select access line. At 612, method 600 may further include deactivating the second select access line. At 614, method 600 may further include sensing data stored in memory cells coupled to odd data lines of the array of memory cells with the first select access line activated and the second select access line deactivated. In one example, activating the even data lines may include activating a plurality of select transistors, each select transistor having a source-drain path coupled between a data line and a memory cell string.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory comprising:
a plurality of data lines including even data lines and odd data lines;
a plurality of memory cell strings including even memory cell strings and odd memory cell strings, each even memory cell string of the plurality of memory cell strings corresponding to an even data line of the plurality of data lines and each odd memory cell string of the plurality of memory cell strings corresponding to an odd data line of the plurality of data lines, and the plurality of memory cells strings grouped into a block of memory cells;
a first select access line coupled to an erased memory cell of each even memory cell string and to a programmed memory cell of each odd memory cell string;
a second select access line coupled to a programmed memory cell of each even memory cell string and to an erased memory cell of each odd memory cell string; and
control logic to activate the second select access line and deactivate the first select access line to read memory cells coupled to the even data lines and to deactivate the second select access line and activate the first select access line to read memory cells coupled to the odd data lines,
wherein, within the block of memory cells, each data line of the plurality of data lines corresponds to a respective single memory cell string of the plurality of memory cell strings.

2. The memory of claim 1, further comprising:
a plurality of first select transistors, each first select transistor having a source-drain path coupled between a data line of the plurality of data lines and a memory cell string of the plurality of memory cell strings; and
a plurality of second select transistors, each second select transistor having a source-drain path coupled to a memory cell string of the plurality of memory cell strings.

3. The memory of claim 2, wherein each of the plurality of first select transistors is directly coupled to a memory cell coupled to the first select access line, and
wherein each memory cell coupled to the first select access line is directly coupled to a memory cell coupled to the second select access line.

4. The memory of claim 2, further comprising:
a common source,
wherein the source-drain path of each second select transistor is coupled between a memory cell string of the plurality of memory cell strings and the common source.

5. The memory of claim 1, wherein the control logic is to initialize the memory by erasing the memory cell of each even memory cell string and programming the memory cell of each odd memory cell string coupled to the first select access line, and by programming the memory cell of each even memory cell string and erasing the memory cell of each odd memory cell string coupled to the second select access line.

6. The memory of claim 1, wherein the memory cells comprise non-volatile memory cells.

7. The memory of claim 1, wherein the plurality of memory cell strings comprise NAND strings.

8. The memory of claim 1, wherein the first select access line is adjacent to the second select access line.

9. The memory of claim 1, wherein the control logic is to deactivate the first select access line to float the odd data lines and to deactivate the second select access line to float the even data lines.

10. The memory of claim 1, further comprising:
a page buffer connected to the plurality of data lines.

11. A method for reading an array of memory cells, the method comprising:
deactivating a first select access line coupled to an erased memory cell of each even memory cell string of a plurality of memory cell strings of the array of memory cells and to a programmed memory cell of each odd memory cell string of the plurality of memory cell strings, each even memory cell string corresponding to an even data line of the array of memory cells and each odd memory cell string corresponding to an odd data line of the array of memory cells, the plurality of memory cell strings grouped into a block of memory cells, and within the block of memory cells, each even data line and each odd data line corresponds to a respective single memory cell string of the plurality of memory cell strings;
activating a second select access line coupled to a programmed memory cell of each even memory cell string and to an erased memory cell of each odd memory cell string; and
sensing data stored in memory cells coupled to the even data lines of the array of memory cells with the first select access line deactivated and the second select access line activated.

12. The method of claim 11, further comprising:
initializing the array of memory cells by erasing the memory cell of each even memory cell string and programming the memory cell of each odd memory cell string coupled to the first select access line, and programming the memory cell of each even memory cell string and erasing the memory cell of each odd memory cell string coupled to the second select access line.

13. The method of claim 11, further comprising:
activating the first select access line;
deactivating the second select access line; and
sensing data stored in memory cells coupled to the odd data lines of the array of memory cells with the first select access line activated and the second select access line deactivated.

14. The method of claim 11, wherein sensing the data stored in the memory cells coupled to the even data lines comprises:
ramping up a selected access line coupled to memory cells for each even data line and each odd data line;
activating the even data lines; and
sensing the data stored in the memory cells of each even data line for the selected access line.

15. The method of claim 14, wherein activating the even data lines comprises activating a plurality of select transistors, each select transistor having a source-drain path coupled between an even or odd data line and a corresponding even or odd memory cell string.

16. The method of claim 11, wherein the array of memory cells comprises a NAND memory array.

17. The method of claim 11, wherein the first select access line is adjacent to the second select access line.

18. A memory comprising:
a plurality of data lines including even data lines and odd data lines;

a plurality of NAND memory cell strings including even memory cell strings and odd memory cell strings, each even memory cell string of the plurality of memory cell strings corresponding to an even data line of the plurality of data lines and each odd memory cell string of the plurality of memory cell strings corresponding to an odd data line of the plurality of data lines, and the plurality of memory cells strings grouped into a block of memory cells;

a first select access line coupled to an erased memory cell of each even memory cell string and to a programmed memory cell of each odd memory cell string;

a second select access line coupled to a programmed memory cell of each even memory cell string and to an erased memory cell of each odd memory cell string; and control logic to activate the second select access line and deactivate the first select access line to read memory cells coupled to the even data lines and to deactivate the second select access line and activate the first select access line to read memory cells coupled to the odd data lines, wherein the control logic is to initialize the memory by erasing the memory cell of each even memory cell string and programming the memory cell of each odd memory cell string coupled to the first select access line, and by programming the memory cell of each even memory cell string and erasing the memory cell of each odd memory cell string coupled to the second select access line, and wherein, within the block of memory cells, each data line of the plurality of data lines corresponds to a respective single memory cell string of the plurality of memory cell strings.

19. The memory claim 18, further comprising:

a plurality of first select transistors, each first select transistor having a source-drain path coupled between a data line of the plurality of data lines and a NAND memory cell string of the plurality of NAND memory cell strings;

a common source; and a plurality of second select transistors, each second select transistor having a source-drain path coupled between a NAND memory cell string of the plurality of NAND memory cell strings and the common source.

20. The memory of claim 18, wherein the memory cells comprise non-volatile memory cells.

* * * * *